United States Patent
Rawson

(10) Patent No.: US 9,237,637 B2
(45) Date of Patent: Jan. 12, 2016

(54) METHOD FOR FORMING AND STABILIZING PRINTED CONDUCTORS ON A FLEXIBLE SUBSTRATE

(75) Inventor: Ian M. Rawson, Austin, TX (US)

(73) Assignee: NCC NANO, LLC, Dallas, TX (US)

( * ) Notice: Subject to any disclaimer, the term of this patent is extended or adjusted under 35 U.S.C. 154(b) by 937 days.

(21) Appl. No.: 13/452,509

(22) Filed: Apr. 20, 2012

(65) Prior Publication Data

US 2012/0207941 A1 Aug. 16, 2012

Related U.S. Application Data

(63) Continuation-in-part of application No. 12/253,399, filed on Oct. 17, 2008, now Pat. No. 8,410,712.

(51) Int. Cl.
| | |
|---|---|
| C08J 7/04 | (2006.01) |
| H05B 41/34 | (2006.01) |
| H05K 3/12 | (2006.01) |
| H05B 33/08 | (2006.01) |
| H05K 1/09 | (2006.01) |

(52) U.S. Cl.
CPC ............ *H05B 41/34* (2013.01); *H05B 33/0896* (2013.01); *H05K 3/1283* (2013.01); *H05K 1/095* (2013.01); *H05K 2203/1545* (2013.01)

(58) Field of Classification Search
CPC ...................................................... C09D 11/00
USPC ......... 427/540, 530, 532, 533, 534, 536, 384, 427/385.5, 96.9, 388.3, 98.5–97.6, 484, 427/372.2, 248.1
See application file for complete search history.

(56) References Cited

U.S. PATENT DOCUMENTS

| | | | |
|---|---|---|---|
| 6,608,129 B1 * | 8/2003 | Koloski et al. | 524/403 |
| 7,901,870 B1 * | 3/2011 | Wach | 430/321 |
| 2003/0087121 A1 * | 5/2003 | Domash et al. | 428/641 |

* cited by examiner

*Primary Examiner* — Minh D A
(74) *Attorney, Agent, or Firm* — Anthony P. Ng; Russell Ng PLLC

(57) ABSTRACT

A method for forming printed conductors on a flexible substrate is disclosed. Initially, an inorganic matrix precursor is printed onto a flexible substrate. The inorganic precursor is then cured with a light pulse to form a porous inorganic matrix thin film. A polymer is subsequently infused into the porous inorganic matrix thin film to form a polymer infused inorganic matrix thin film.

16 Claims, 3 Drawing Sheets

METHOD FOR FORMING AND STABILIZING PRINTED CONDUCTORS ON A FLEXIBLE SUBSTRATE

RELATED APPLICATION

The present application is a continuation-in-part of patent application Ser. No. 12/253,399 filed on Oct. 17, 2008 now U.S. Pat. No. 8,410,712, the pertinent of which is incorporated herein by reference.

BACKGROUND OF THE INVENTION

1. Technical Field

The present invention relates to thermal processing in general, and, in particular, to a method for forming printed conductors on a flexible substrate.

2. Description of Related Art

Printed electronics is the convergence of the semiconductor industry and the printing industry. The notion of printing electronic circuits instead of printing reading materials is seductive to printers as they can see the potential for performing higher value print jobs without making major changes to their equipment. By the same token, electronic circuit manufacturers also view the notion of printing electronic circuits as equally seductive because it allows them to fabricate electronic circuits in large volumes at a relatively low cost.

One of the goals of printed electronics is the fabrication of electronic components, such as transistors, capacitors, resistors, etc., on low-temperature substrates, such as paper and plastic, via printing technology. One technique of fabricating electronic components is to print a dispersion of a particulate precursor directly onto a substrate. After printing, the material is then thermally cured to sinter the precursor particles into the final structure.

For example, silver nanoparticles can be printed onto a polyethylene terephthalate (PET) film or paper sheet via a screen, flexographic, gravure or inkjet printer. Afterwards, the nanoparticles are sintered using an oven operating at a relatively low temperature to form a highly conductive metal trace that is mesoporous or foamed. Printed silver is very reliable primarily due to the fact that it does not appreciably oxidize. Printed silver not only retains its bulk electrical conductivity, but its contact resistance remains low over time. Mechanically, printed silver is very stable, which makes it compatible with flexible substrates.

In order to reduce costs, copper is preferred over silver. Unfortunately, the comparatively inexpensive printed copper will oxidize over time. The copper oxidization causes multiple problems. When copper oxidizes, it expands and the expansion can cause delamination from the substrate and stress-corrosion-cracking in the inorganic film. In addition, since copper oxide is not conductive, both the bulk resistance and the contact resistance are increased. Finally, copper oxide is brittle, which makes it incompatible with a flexible substrate. This problem is exasperated when the flexible substrate is repeatedly flexed.

Consequently, it would be desirable to provide a method for forming an inexpensive printed conductor, such as copper, on a flexible substrate.

SUMMARY OF THE INVENTION

In accordance with a preferred embodiment of the present invention, an inorganic matrix precursor is initially printed onto a flexible substrate. The inorganic precursor is then cured with a light pulse to form a porous inorganic matrix thin film. A polymer is subsequently infused into the porous inorganic matrix thin film to form a polymer infused inorganic matrix thin film.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
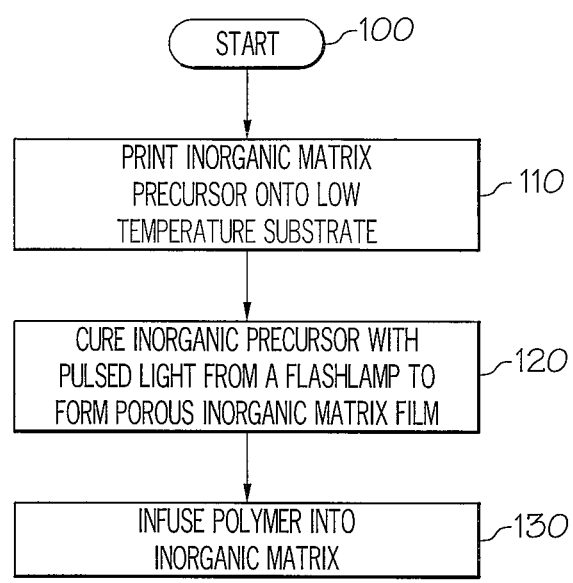
FIG. 1 is a flow diagram of a method for forming printed conductors on a flexible substrate, in accordance with a preferred embodiment of the present invention.

Referring now to the drawings and in particular to FIG. 1, there is depicted a flow diagram of a method for forming printed conductors on a flexible substrate, in accordance with a preferred embodiment of the present invention. Starting at block 100, a layer of inorganic matrix precursor is initially printed onto a flexible substrate, as shown in block 110. The inorganic matrix precursor is then cured with a light pulse from a flashlamp to form a porous inorganic matrix thin film, as depicted in block 120. An exemplary curing apparatus for providing the above-mentioned light pulse is further described in details in FIG. 2. Finally, a polymer is infused into the porous inorganic matrix thin film, as shown in block 130.

The purpose of the polymer is to support the metal network mechanically while simultaneously inhibiting its corrosion. Thus, by filling the internal pore space of the porous inorganic matrix thin film with a polymer, the mechanical instability and corrosion problem of the porous inorganic matrix thin film can be eliminated. Basically, the polymer displaces water or corrosive agents contained within the porous inorganic matrix thin film or substrate.

Figure 2:
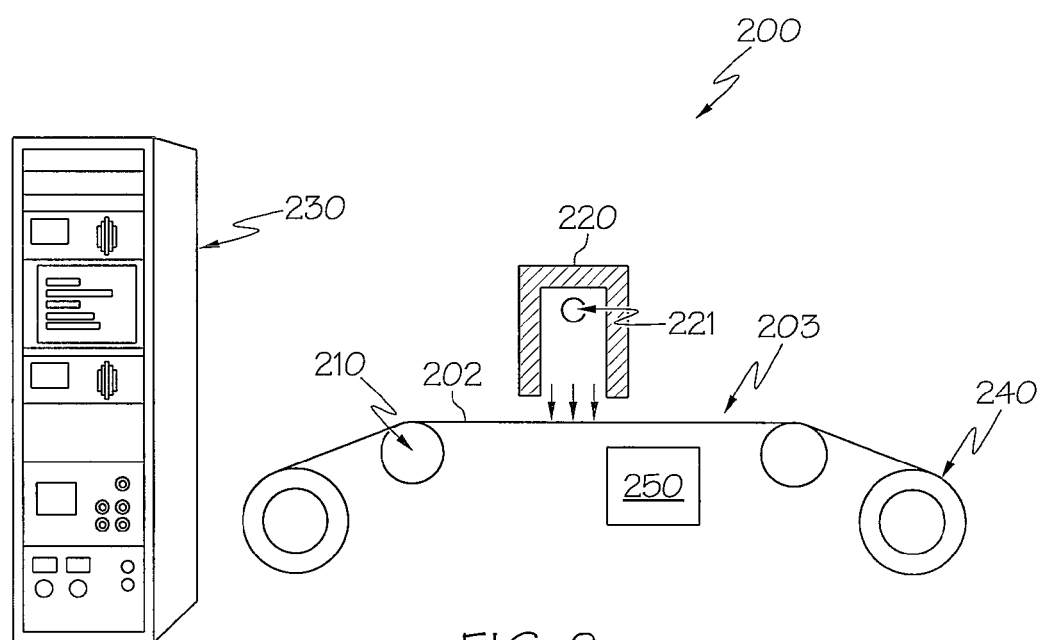
FIG. 2 is a diagram of a curing apparatus, in accordance with a preferred embodiment of the present invention.

With reference now to FIG. 2, there is illustrated a diagram of a curing apparatus in accordance with a preferred embodiment of the present invention. As shown, a curing apparatus 200 includes a conveyor system 210, a strobe head 220, a relay rack 230 and a reel-to-reel feeding system 240. Curing apparatus 200 is capable of curing a thin film 202 mounted on a low-temperature substrate 203 situated on a web being conveying past strobe head 220 at a relatively high speed. Conveyor system 210 can preferably operate at speeds from 2 to 1000 feet/min to move substrate 203. Curing apparatus 200 can preferably accommodate a web width of any width in 3-inch increments. Thin film 202 can be added on substrate 203 by one or combinations of existing technologies such as screen-printing, inkjet printing, gravure, laser printing, xerography, pad printing, painting, dip-pen, syringe, airbrush, flexographic, CVD, PECVD, evaporation, sputtering, etc. The deposition of thin film 202 onto substrate 203 may be performed inline with the curing process.

Strobe head 220, which is preferably water cooled, includes a high-intensity pulsed xenon flash lamp 221 for curing thin film 202 located on substrate 203. Pulsed xenon flash lamp 221 can provide pulses of different intensity, pulse length, and pulse repetition frequency. For example, pulsed xenon lamp 221 can provide 10 μs to 10 ms pulses with a 3" by 6" wide footprint at a pulse repetition rate of up to 1 kHz. The spectral content of the emissions from pulsed xenon flash lamp 221 ranges from 200 nm to 2,500 nm. The spectrum can be adjusted by replacing the quartz lamp with a cerium doped quartz lamp to remove most of the emission below 350 nm. The quartz lamp can also be replaced with a sapphire lamp to extend the emission from approximately 140 nm to approximately 4,500 nm. Filters may also be added to remove other portions of the spectrum. Flash lamp 221 can also be a water wall flash lamp that is sometimes referred to as a Directed Plasma Arc (DPA) lamp.

Relay rack 230 includes an adjustable power supply, a conveyance control module, and a strobe control module. The adjustable power supply can produce pulses with an energy of up to 4 kilojoules per pulse. Adjustable power supply is connected to pulsed xenon flash lamp 221, and the intensity of the emission from pulsed xenon flash lamp 221 can be varied by controlling the amount of current passing through pulsed xenon flash lamp 221.

The adjustable power supply controls the emission intensity of pulsed xenon flash lamp 221. The power, pulse duration and pulse repetition frequency of the emission from pulsed xenon flash lamp 221 are electronically adjusted and synchronized to the web speed to allow optimum curing of thin film 202 without damaging substrate 203, depending on the optical, thermal and geometric properties of thin film 202 and substrate 203.

During the curing operation, substrate 203 as well as thin film 202 are being moved by conveyor system 210. Conveyor system 210 moves thin film 202 under strobe head 220 where thin film 202 is cured by rapid pulses from pulsed xenon flash lamp 221. The power, duration and repetition rate of the emissions from pulsed xenon flash lamp 221 are controlled by strobe control module, and the speed at which substrate 203 is being moved past strobe head 220 is determined by conveyor control module.

When flash lamp 221 is pulsed, thin film 202 is momentarily heated to provide energy for curing thin film 202. When a rapid pulse train is combined with moving substrate 203, a uniform cure can be attained over an arbitrarily large area as each section of thin film 202 may be exposed to multiple pulses, which approximates a continuous curing system such as an oven.

After the porous inorganic matrix thin film has been formed, the removal of corrosive agents, such as water used in printing or coating, can be achieve through the choice of solvents used during the polymer infusion process. In the case of solvent-applied polymer films, a solvent such as ethanol may directly interact with residual water and changes its thermodynamic properties to cause the water to evaporate more easily by azeotrope formation or by directly absorbing the small amount of residual water into the much greater volume of solvent in the case of bath coating.

Figure 3A:
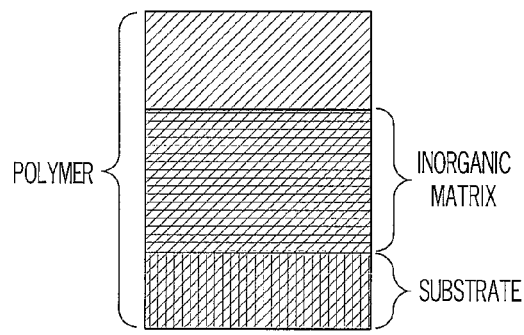
FIG. 3 is a diagram showing a process of infusing a polymer from a solvent.
Figure 3B:
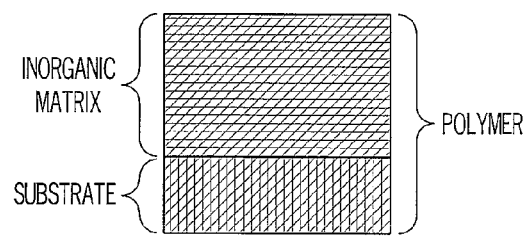

Various methods can be utilized to infuse a polymer into a porous inorganic matrix thin film. A first method for infusing a polymer into the inorganic matrix thin film is to dissolve the polymer into a solvent and then apply the dissolved polymer to the inorganic matrix thin film, as shown in FIG. 3. If the substrate is porous, then it may be infused either by dipping or coating the solution from the back, the front or both sides of the substrate. If the substrate is non-porous, then an infusion from the top surface may be used, as shown in FIG. 3a. After the solvent has been removed via drying, the polymer is retained within the inorganic matrix, as depicted in FIG. 3b. By controlling the polymer-to-solvent ratio within the solution and the amount of solution applied, adequate polymer can be introduced to greatly retard corrosion of the inorganic matrix thin film in order to provide mechanical stability (adhesion, cohesion, and flexural cycling) to the inorganic matrix thin film while retaining a very low contact resistance.

The polymer dissolved in solvent described herein can be further strengthened through the addition of cross-linking agents that may be added to the original formulation or applied to the inorganic matrix thin film after application. Cross-linking allows for substantial improvements to the polymer's physical properties through the increase of the original polymer's molecular weight, addition of functional units or through branching a linear polymer and in many cases attaching one chain to another. Cross-linking a polymer can improve its rigidity, gas barrier and ultimate yield stress.

A polymer may be infused into the inorganic matrix thin film via hot infusion of low molecular weight and consequently high melt flow rate polymer. This polymer does not mix with residual water, but instead force water out directly because of its immiscibility with water and very low surface tension. Often, a polymer that must be handled well above the boiling point of water is selected, which is equally advantageous as boiling may force residual water from the inorganic matrix even more quickly and completely. This process also significantly modifies the inorganic matrix thin film's surface tension, area and reactivity through the specifically controlled formation of a polymer film within the pore structure and a limited deposition at the top surface interface between the inorganic matrix thin film and air.

The application method limits the thickness of the surface film such that the contact resistance between an external electronic element and the inorganic matrix thin film is not significantly increased compared to the resistivity of the inorganic foam on which it is deposited. Proper care must be used in the formulation of the polymer composition used for the present method because its primary requirement is to allow for electrical access to the inorganic matrix thin film in a later process. Particular selections of polymer allow for dramatic improvement in bend radius, abrasion resistance, hardness, adhesion to the substrate, imparts resistance to water and, if extremely low surface tension polymers are use, causes water shedding behavior. The lowest surface tension is achieved through the use of very low molecular weight organic polymers, fluorinated organic polymers or silicones, which infuse easily into the pore space of the substrate and inorganic foam under the application of heat. No additional pressure is required because the capillary force is more than enough to move the inviscid polymers. Though more viscous formulations may be employed along with the application of pressure after the polymer has been coated onto the substrate and the system is still hot. Bend resistance is improved by moving the neutral bending plane or the depth into a surface that stress from applied forces is zero. The mechanical properties of the applied coating such as elasticity and thickness determine how far the neutral bending plane has been displaced when compared to the uncoated substrate, which is the worst case, because the top surface is the plane of highest stress when considering bending in tension or compression.

Example 1

Solvent Applied Polymer on Paper Substrate

A screen printable version of a copper oxide reduction ink (part # ICI-021 available from NovaCentrix in Austin, Tex.)

was printed on Wausau exact index paper. The ink was converted to a highly conductive mesoporous copper matrix thin film using the PulseForge® 3200 photonic curing system manufactured by NovaCentrix in Austin, Tex. The porous copper matrix thin film was then filled with a polymer via the following process.

10% Kuraray B16H polyvinylbutyral was mixed into 90% ethanol, by weight using a magnetic stir plate for 30 minutes. The entire substrate was submerged into the bath, removed, and dried at 60° C. for 5 minutes in an oven. After drying, the electrical resistance of the thin film was approximately the same as before the polymer infusion. The contact resistance was less than 0.5 Ω.

Modifications of the Solvent-Based Formulation

Appropriate cross-linking agents such as polyisocyanates, dialdehydes as well as melamine, phenolics and epoxide resins may be added for further improvement to mechanical and chemical properties. To induce cross-linking in the applied polymer film, the 90% ethanol in the above-mentioned formulation may be replaced by the same mass fraction of an appropriate —OH free solvent such as Acetone. The remaining 10% B16 H may be exchanged with a 1:1 to 1:2 combination of polyvinylbutyral grade B30HH also available from Kuraray and Desmodure N75 Aliphatic polyisocynanate available from Bayer Material Science as well as its associated catalysts: dibutylin dilaurate at a level of 0.005-0.01%, Desmorapid PP up to 0.5% or 8.0% zinc octoate up to 0.2% with respect to total resin content. The water sensitivity of this formulation modification allows for a polymer over-coating system that cross-links in response to the presence of residual water.

Additional corrosion inhibiting charged polymers such as polyvinyl-pyrolidone and polyethylenimine can be added to the base formulation of 10% B16H in ethanol at levels between 2-10% of the B16H content. Charged polymers such as polyethylenimine inhibit corrosion reactions by binding to oppositely charged sites of the metal and polymer to which they are applied and electrostatically repulsing charged corrosive chemicals as well as, in some cases directly reaction with the corrosive species. Further augmentation of this effect maybe carried out through adjustment and fine control of the mixture's pH, which directly effects the charge of the polymer. For the majority of inorganic foams this approach may be applied to the pH should maintained between 6.5 and 7.5 with the preferred value between 6.7 and 7.0.

Additional corrosion inhibiting pigments may also be added to the base formulation if transparency is not required. Silicates clay platelets such as Montmorillonite or Kaolin such as Polyplate available from KaMin, LLC (formerly Huber Kaolin) or Microtalc IT extra available from Mondo Minerals. Alternatively or in concert, zinc orthophosphate hydrates such as Heucophos ZPO available from Heucotech, Ltd. can also be utilized. Because these additives quickly increase the viscosity of the solution, causing excess surface deposition, they must generally be kept below 5% of the total formulation. Formulations of this type may be made using 85-89% ethanol or acetone, 10% B16H and 1-5% silicates.

Figure 4A:
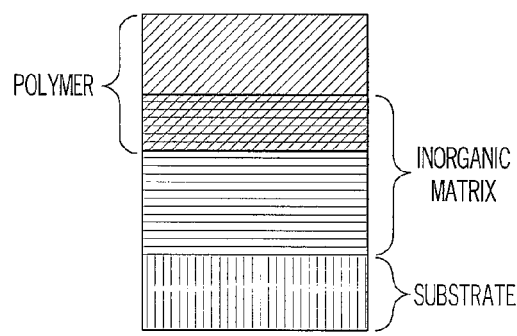
FIG. 4 is a diagram showing a process of infusing a low melt flow rate polymer via external pressure.
Figure 4B:
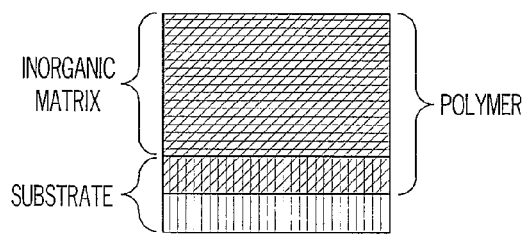

A second method for infusing a polymer into the inorganic matrix thin film is to melt a polymer and apply the melted polymer to the matrix directly, as depicted in FIG. 4. Depending on the viscosity and surface tension of the molten polymer and pore size and thickness of the matrix, the polymer can be wicked into the inorganic matrix thin film directly by dipping the substrate into the melt or coating the substrate with the melt, or pressure can be applied to aid in the infusion of the polymer into the matrix, as shown in FIG. 4a. After the pressure has been removed, the polymer is retained within the inorganic matrix and the substrate, as depicted in FIG. 4b.

The deposited polymer improves mechanical properties such as abrasion and bend resistance through the movement of the neutral bending plane and filling of the pore space and chemical resistance the inhibition of surface area and chemical reactivity as well as modifying the absorptive properties of the, previously high surface tension, inorganic foam. The examples below detail the polymer coating formulations and substrate information such that the inorganic foam may be accessed electronically in a following step without the use of the polymers solvent to dissolve the surface layer or the further application of heat and pressure in the cause of melt infusion.

Example 2

Hot-Melt Applied Polymer on Paper Substrate

A screen printable version of a copper oxide reduction ink (part # ICI-021 available from NovaCentrix in Austin, Tex.) was printed on Wausau exact index paper. The ink was converted to a highly conductive mesoporous copper inorganic matrix thin film using the PulseForge® 3200 photonic curing system. The porous copper inorganic matrix thin film was then filled with polymer via the following process.

BeSquare and Vybar (both available from Baker Hughes Specialty Polymers) were mixed at a weight ration of 1:1 and heated in a beaker at 150° C. The conductive trace and substrate was laid on top of the molten polymer with the backside against the liquid thereby allowing it to be absorbed into the paper matrix and ultimately the copper matrix. After it was uniformly saturated, the excess polymer was removed from the backside of the substrate with a doctor blade and allowed to cool. After cooling, the electrical resistance of the thin film was approximately the same as before polymer infusion. The contact resistance was less than 0.50.

Modifications of the Hot-Melt Formulation

Pigment additives such as those mentioned in Example 1 may also be added to hot-melt formulations at less than 5% total mass fractions for improvement of mechanical and chemical properties without detrimental increase melt viscosity.

Mechanical and chemical properties of low molecular weight polyethylene hot-melt formulations, such as above, may also be enhanced through the addition of poly(ethylene-co-vinyl acetate) such as Elvax available from Dupont may be used with vinyl acetate contents between 17-25%. Formulations were made with Sigma Aldrich butylated hydroxytoluene inhibited poly(ethylene-co-vinyl acetate) between 17-25% vinyl acetate content at up 1:1 mass fraction with Baker Hughes Specialty Polymer's Polywax. Formulations were also made using up to 1:1 Sigma Aldritch poly(ethylene-co-vinyl acetate) and the Besquare and Vybar base formulation above.

A third method for infusing a polymer into an inorganic matrix thin film is to apply an ultra-violet (UV) curable polymer and cure it after infusion.

Example 3

UV Curable Polymer Applied on Paper Substrate

A screen printable version of a copper oxide reduction ink (part # ICI-021 available from NovaCentrix in Austin, Tex.) was printed on Wausau exact index paper. The ink was converted to a highly conductive mesoporous copper matrix thin film using PulseForge® 3200 photonic curing system. The porous copper matrix thin film was then filled with a UV curable polymer via the following process.

A UV curable polymer formulation was formulated with the elements in Table I. The conductive trace and substrate was laid on top of the formulation with the backside against the liquid thereby allowing it to be absorbed into the paper matrix and ultimately the copper matrix. The formulation was cured using a PulseForge® 3100 photonic curing system manufactured by NovaCentrix in Austin, Tex. After processing, the electrical resistance of the trace was approximately the same as before polymer infusion. The contact resistance was less than 0.5Ω.

TABLE I

| Manufacturer | Product | % |
|---|---|---|
| Sartomer | CN985B88 | 40% |
| Sartomer | SR833S | 25% |
| Sartomer | CD420 | 15% |
| Sartomer | CD9055 | 10% |
| Sartomer | CN371 | 5% |
| Lamberti | KT046 (Esacure) | 4% |

Samples of polymer infused porous copper traces were placed into standard ocean salinity salt water and 15% hydrochloric acid solutions in order to test the improvement to corrosion resistances proved by the polymer infusion process. Bare samples reacted with the solution in a matter of minutes by changing color or delaminating from the substrate. However, infused samples retained their color and structure for several weeks. Infused samples also displayed reduced surface energy and increased water-shedding behavior.

Bare samples of photonically cured porous copper films display poor bend endurance, doubling when bent around a 1-inch radius. For the same type of sample, the addition of polymer infusion allows for a hundred cycles before a significant change in resistance can be detected. A similar process was carried out using a photonically cured print of HPS-021 silver screen print ink on Wausau exact index paper. In this case the bare sample displays and increase in resistance when bent around a 1 millimeter radius, the addition of polymer infusion to the same type of sample again allows for retention of the same resistance value over a hundred cycles.

As has been described, the present invention provides a method for forming printed conductors on a flexible substrate.

While the invention has been particularly shown and described with reference to a preferred embodiment, it will be understood by those skilled in the art that various changes in form and detail may be made therein without departing from the spirit and scope of the invention.

What is claimed is:

1. A method for forming printed conductors on a flexible substrate, said method comprising:
   printing an inorganic matrix precursor onto a flexible substrate;
   curing said inorganic precursor with a light pulse to form a porous inorganic matrix thin film; and
   infusing a polymer into said porous inorganic matrix thin film to form a polymer infused inorganic matrix thin film.

2. The method of claim 1, wherein said infusing further includes infusing a solvent-applied polymer.

3. The method of claim 1, wherein said infusing further includes infusing a low-melt flow rate polymer.

4. The method of claim 1, wherein said infusing further includes infusing a UV-curable polymer.

5. The method of claim 1, wherein said inorganic matrix thin film is a metal.

6. The method of claim 1, wherein said inorganic matrix thin film is copper.

7. The method of claim 1, wherein said inorganic matrix thin film is electrically conductive.

8. The method of claim 1, wherein a contact resistance of said polymer infused inorganic matrix thin film is less than 0.5 Ω.

9. A method for forming printed conductors on a flexible substrate, said method comprising:
   forming a porous inorganic matrix thin film onto a flexible substrate; and
   infusing a polymer into said porous inorganic matrix thin film to form a polymer infused inorganic matrix thin film.

10. The method of claim 9, wherein said infusing further includes infusing a solvent-applied polymer.

11. The method of claim 9, wherein said infusing further includes infusing a low-melt flow rate polymer.

12. The method of claim 9, wherein said infusing further includes infusing a UV-curable polymer.

13. The method of claim 9, wherein said inorganic matrix thin film is a metal.

14. The method of claim 9, wherein said inorganic matrix thin film is copper.

15. The method of claim 9, wherein said inorganic matrix thin film is electrically conductive.

16. The method of claim 9, wherein a contact resistance of said polymer infused inorganic matrix thin film is less than 0.5 Ω.

* * * * *